United States Patent
Koyama

(10) Patent No.: US 9,520,516 B2
(45) Date of Patent: Dec. 13, 2016

(54) PHOTODETECTION SEMICONDUCTOR DEVICE HAVING LIGHT RECEIVING ELEMENT

(71) Applicant: SII Semiconductor Corporation, Chiba-shi, Chiba (JP)

(72) Inventor: Takeshi Koyama, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 15/040,734

(22) Filed: Feb. 10, 2016

(65) Prior Publication Data

US 2016/0240710 A1 Aug. 18, 2016

(30) Foreign Application Priority Data

Feb. 16, 2015 (JP) .................. 2015-027888

(51) Int. Cl.
*H01L 21/00* (2006.01)
*H01L 31/0352* (2006.01)
*H01L 31/0232* (2014.01)
*H01L 31/0224* (2006.01)

(52) U.S. Cl.
CPC . *H01L 31/035281* (2013.01); *H01L 31/02327* (2013.01); *H01L 31/022408* (2013.01)

(58) Field of Classification Search
CPC .................. H01L 31/035281; H01L 31/02327; H01L 31/022408
See application file for complete search history.

(56) References Cited

U.S. PATENT DOCUMENTS

2012/0104464 A1* 5/2012 Janesick ................. H01L 21/84
257/223
2012/0139018 A1* 6/2012 Narisawa .......... H01L 27/14689
257/292

OTHER PUBLICATIONS

Abstract, Publication No. JP 2002-237614, Publication date Aug. 23, 2002.

* cited by examiner

*Primary Examiner* — Richard Booth
(74) *Attorney, Agent, or Firm* — Adams & Wilks

(57) ABSTRACT

In order to provide a photodetection semiconductor device including a light receiving element configured to reduce afterimages, a photodiode is formed by a PN junction into a circular shape so that a uniform distance from an end portion of a light receiving element to an electrode serving as a carrier outlet is realized, to thereby enable carriers to be uniformly taken out from all directions.

4 Claims, 4 Drawing Sheets

PHOTODETECTION SEMICONDUCTOR DEVICE HAVING LIGHT RECEIVING ELEMENT

BACKGROUND OF THE INVENTION

1. Field of the Invention

The present invention relates to a photodetection semiconductor device having a light receiving element.

2. Description of the Related Art

A CMOS image sensor includes, in general, light receiving pixel arrays as light receiving elements, in which light receiving elements are one-dimensionally or two-dimensionally arrayed. Each of the pixels includes a photodetector formed from a PN junction photodiode. Incident light into the pixels is absorbed in a semiconductor substrate to generate carriers, which recombine at a depletion layer portion of the photodiode, and then an output may be obtained as voltage or current.

Due to demands for attaining a higher speed of the device using a CMOS image sensor, a shorter read-out time of the CMOS image sensor is required. Thus, carriers stored in the photodiodes may fail to reach an electrode serving as a carrier outlet, and may appear as an afterimage at the next reading. Further, when an area of the light receiving element is increased in order to improve the sensitivity of the CMOS image sensor, a distance from an end portion of the light receiving element to the electrode serving as the carrier outlet is increased to be longer than a distance of moving carrier through diffusion, resulting in afterimages.

As one of improvement measures for preventing the generation of afterimages, there is proposed a method of reducing afterimages, involving providing electric potential gradient to light receiving elements to cause drift, thereby increasing the moving speed of carriers (for example, see Japanese Patent Application Laid-open No. 2002-237614).

However, when the potential gradient is provided into the light receiving elements, a period for eliminating a potential difference is necessary, and hence the demands for attaining a higher speed cannot be satisfied.

SUMMARY OF THE INVENTION

In view of the above, it is an object of the present invention to provide a photodetection semiconductor device having a light receiving element in which carriers can be uniformly taken out from all directions and demands for attaining a higher speed is satisfied.

In order to achieve the above-mentioned object, a photodetection semiconductor device according to one embodiment of the present invention has the following configuration. The photodetection semiconductor device includes a light receiving element including: a first conductivity type semiconductor substrate; a circular second conductivity type semiconductor region coupled to the semiconductor substrate, to thereby form a photodiode; and a circular third conductivity type high concentration region formed in the second semiconductor region, a plurality of the photodiodes being arranged in an array.

According to the one embodiment of the present invention, the photodetection semiconductor device including the light receiving element can be provided, the light receiving element having a uniform distance between the end portion of the light receiving element and an electrode serving as a carrier outlet, and thus enabling carriers to be uniformly taken out from all directions, to thereby reduce afterimages.

DETAILED DESCRIPTION OF THE INVENTION

Modes for carrying out the present invention are described in detail in the following by way of embodiments with reference to the drawings.

First Embodiment

Figure 1:
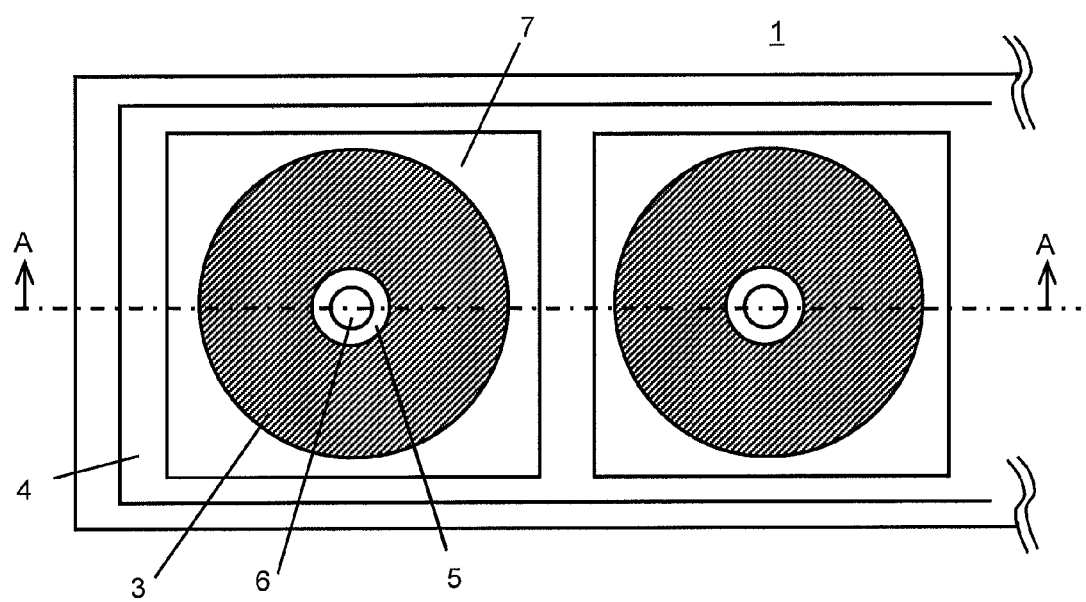
FIG. 1 is a plan view of a light receiving element of a photodetection semiconductor device according to a first embodiment of the present invention.
Figure 2:
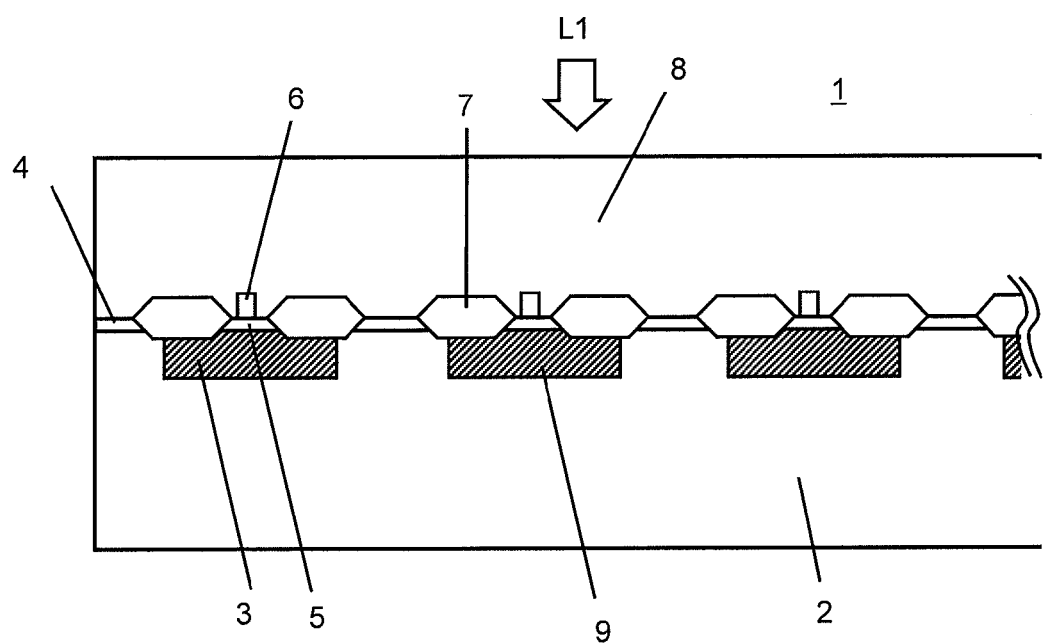
FIG. 2 is a sectional view of the photodetection semiconductor device taken along the line A-A of FIG. 1.

FIG. 1 is a plan view of a photodetection semiconductor device according to a first embodiment of the present invention, for illustrating a light receiving portion in which photodiodes serving as light receiving elements are formed. FIG. 2 is a sectional view of the photodetection semiconductor device taken along the line A-A of FIG. 1.

A light receiving portion 1 includes a P-type semiconductor substrate 2, an N-type well region 3, a P-type semiconductor region 4, an N-type semiconductor region 5, an anode electrode 6, an element isolation region 7, and an insulating layer 8.

The semiconductor substrate 2 is, for example, a single crystal substrate made of silicon. The insulating film 8 is formed, for example, of a silicon oxide film or a silicon nitride film, and functions as a protective film of the surface of the semiconductor. The N-type well region 3 is a well region formed by diffusing N-type impurities into the semiconductor substrate 2 from the surface thereof, having a columnar shape, and also has a circular shape in a plan view as seen from the upper part of the semiconductor substrate. A photodiode 9 is formed by a PN junction between the N-type well region 3 and the semiconductor substrate 2.

The N-type semiconductor region 5 is a region in which N-type impurities are diffused with high concentration, and is formed concentrically inside the N-type well region 3. The anode electrode 6 is formed of a metal material formed at the center of the N-type semiconductor region 5, is formed into a circular shape or a rectangular shape by sputtering, for example, and is electrically connected to the N-type well region 3 via the N-type semiconductor region 5.

The photodiode 9 is applied with bias so that a potential of the anode electrode 6 becomes higher than a potential of the P-type semiconductor substrate 2 forming a cathode, and a depletion layer thus extends between the semiconductor substrate 2 and the N-type well region 3, working as a photodetection region for taking carriers generated by incident light. Since the depletion layer extends along the PN junction, the depletion layer has a columnar shape having a side surface and bottom portions such as that of a tea canister or a drinking glass in this embodiment.

The P-type semiconductor region 4 is formed along the surface of the semiconductor substrate 2 so as to surround the N-type well region 3. The P-type semiconductor region 4 is formed for the purpose of preventing inversion of the surface of the semiconductor substrate 2.

On the surface of the N-type well region 3, the element isolation region 7 including a thick oxide film is formed. The element isolation region 7 is formed around the N-type semiconductor region 5 to define the shape of the N-type semiconductor region 5. The element isolation region 7 has a shape with a round hole so as not to be formed on the surface of the N-type semiconductor region 5. A region of the element isolation region 7 outside the N-type well region 3 may have a rectangular shape or a circular shape, and hence the element isolation region 7 has a donut shape with a rectangular or circular outline. The element isolation region 7 may be formed continuously to an element isolation region formed around an adjacent photodiode, or may be formed separately from the element isolation region. As a matter of course, when the element isolation regions are continuously formed, the donut shapes are continuous and there is no separate donut shape.

When light L1 enters the light receiving portion 1, the light L1 transmits through the insulating film 8 and the element isolation region 7, and respective wavelength components of the incident light L1 reach the inside of the semiconductor substrate 2 depending on light energy, to thereby generate carriers. The carriers diffuse to reach the depletion layer region of the PN junction, and an output is obtained as voltage or current. In this embodiment, the N-type semiconductor region 5 is formed at the center of the N-type well region 3, and the N-type semiconductor region 5 and the N-type well region 3 are formed into circular shapes. In this way, the uniform distance between the N-type semiconductor region 5 and the end portion of the N-type well region 3 is realized, and uniform carrier diffusion from all directions is promoted, thereby being capable of suppressing afterimages.

Note that, FIG. 1 and FIG. 2 are illustrations of the light receiving portion in which the photodiodes are one-dimensionally arrayed. As a matter of course, the present invention is applicable also to a light receiving portion in the same manner, in which photodiodes are two-dimensionally arrayed.

Second Embodiment

Figure 3:
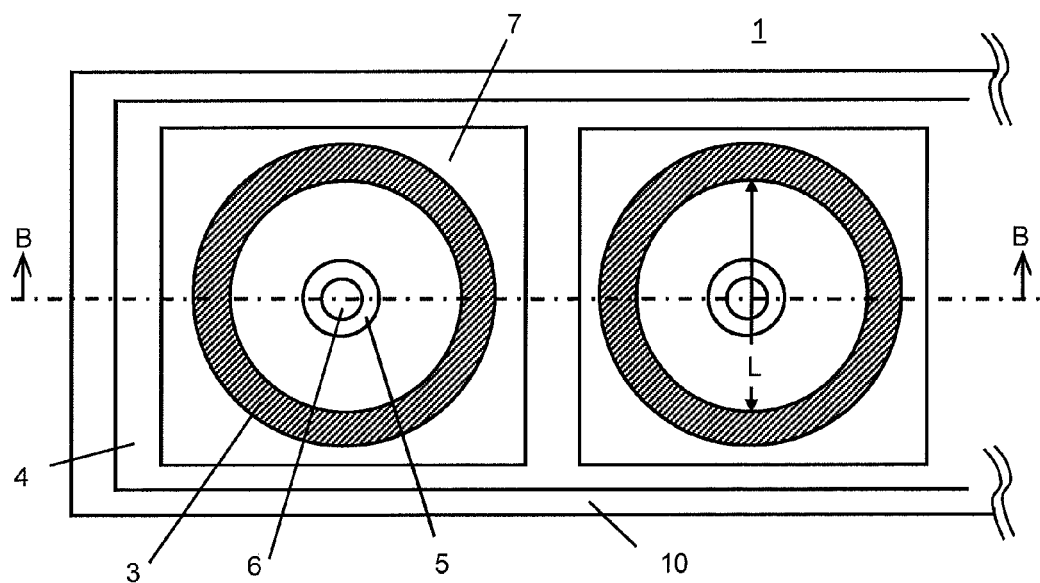
FIG. 3 is a plan view of a light receiving element of a photodetection semiconductor device according to a second embodiment of the present invention.
Figure 4:
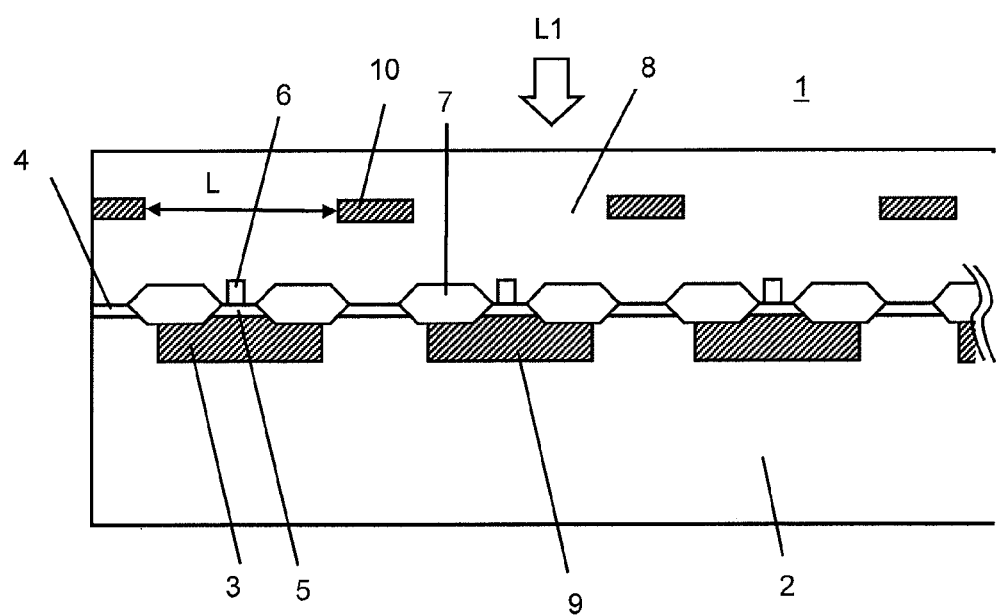
FIG. 4 is a sectional view of the photodetection semiconductor device taken along the line B-B of FIG. 3.

FIG. 3 is a plan view of a photodetection semiconductor device according to a second embodiment of the present invention, for illustrating a light receiving portion in which photodiodes serving as light receiving elements are formed. FIG. 4 is a sectional view of the photodetection semiconductor device taken along the line B-B of FIG. 3. Parts corresponding to those of FIG. 1 are denoted by the same reference numerals. The second embodiment differs from the first embodiment illustrated in FIG. 1 in that a wiring layer 10 is formed as a light blocking portion for preventing crosstalk. The wiring layer 10 has a circular opening so as to cover over the entire surface of the light receiving portion except for the N-type well region 3. An opening width L of the wiring layer 10 is changed depending on a desired afterimage characteristic.

Further, a plurality of the wiring layers 10 may be formed.

Further, in the case of forming the circular opening in the wiring layer 10, the circular opening portion of the wiring layer 10 forms the incident light L1 to enter the N-type well region into a circular shape. Thus, when the N-type semiconductor region 5 and the anode electrode 6 are concentrically formed below the center of the circular opening portion, the uniform maximum distance in which carriers move is realized in all the directions. In this case, the N-type well region does not necessarily have a circular shape and may have a rectangular shape.

What is claimed is:

1. A photodetection semiconductor device including a light receiving element,
the light receiving element comprising:
a first conductivity type semiconductor substrate;
a circular second conductivity type well region formed into the first conductivity type semiconductor substrate from a surface of the first conductivity type semiconductor substrate;
a photodiode formed between the circular second conductivity type well region and the first conductivity type semiconductor substrate;
a second conductivity type semiconductor region concentrically formed inside the circular second conductivity type well region; and
an element isolation region for covering a region from around the circular second conductivity type well region to around the second conductivity type semiconductor region.

2. A photodetection semiconductor device including a light receiving element according to claim 1, wherein the light receiving element further comprises a wiring layer for blocking light that is formed above the photodiode and has a circular opening.

3. A photodetection semiconductor device including a light receiving element according to claim 2, wherein the wiring layer for blocking light comprises a plurality of wiring layers for blocking light.

4. A photodetection semiconductor device including a light receiving element,
the light receiving element comprising:
a first conductivity type semiconductor substrate;
a photodiode formed by a rectangular second conductivity type semiconductor region coupled to the first conductivity type semiconductor substrate;
a wiring layer for blocking light formed above the rectangular second conductivity type semiconductor region of the photodiode, and having a circular opening; and
an N-type semiconductor region and an anode electrode both formed concentrically below a center of the circular opening of the wiring layer for blocking light.

* * * * *